United States Patent
You et al.

(10) Patent No.: US 12,236,995 B2
(45) Date of Patent: Feb. 25, 2025

(54) MEMORY DEVICE, MEMORY SYSTEM HAVING THE SAME AND METHOD OF OPERATING THE SAME

(71) Applicant: SAMSUNG ELECTRONICS CO., LTD., Suwon-si (KR)

(72) Inventors: Jungmin You, Hwaseong-si (KR); Seongjin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/426,503

(22) Filed: Jan. 30, 2024

(65) Prior Publication Data

US 2024/0170037 A1    May 23, 2024

Related U.S. Application Data

(63) Continuation of application No. 17/724,942, filed on Apr. 20, 2022, now Pat. No. 11,922,989.

(30) Foreign Application Priority Data

Sep. 29, 2021    (KR) .......................... 10-2021-0128452

(51) Int. Cl.
  *G11C 11/406*    (2006.01)
  *G11C 11/4093*    (2006.01)

(52) U.S. Cl.
  CPC .. *G11C 11/40615* (2013.01); *G11C 11/40622* (2013.01); *G11C 11/40626* (2013.01); *G11C 11/4093* (2013.01)

(58) Field of Classification Search
  CPC ........ G11C 11/40615; G11C 11/40622; G11C 11/40626; G11C 11/4093
  See application file for complete search history.

(56) References Cited

U.S. PATENT DOCUMENTS

| | | | |
|---|---|---|---|
| 9,087,602 B2 | 7/2015 | Youn et al. | |
| 9,865,326 B2 | 1/2018 | Bains et al. | |
| 9,940,991 B2 * | 4/2018 | Kim | ................... G11C 11/40622 |
| 9,978,440 B2 | 5/2018 | Cho | |
| 10,236,035 B1 | 3/2019 | Lee et al. | |
| 10,446,216 B2 | 10/2019 | Oh et al. | |
| 10,593,391 B2 | 3/2020 | Zhao et al. | |
| 10,665,273 B2 * | 5/2020 | Kim | ................... G11C 11/40615 |
| 11,037,617 B2 | 6/2021 | Gans | |
| 11,961,550 B2 * | 4/2024 | Kim | .................... G11C 11/4085 |
| 2012/0300569 A1 | 11/2012 | Cho | |

(Continued)

FOREIGN PATENT DOCUMENTS

KR    10-2012-0130871    12/2012

*Primary Examiner* — Son L Mai

(74) *Attorney, Agent, or Firm* — F. CHAU & ASSOCIATES, LLC

(57) ABSTRACT

A memory device includes a memory cell array having a plurality of memory cells connected to wordlines and bitlines, a target row refresh logic configured to perform a refresh operation on at least one of target rows of the memory cell array in response to a refresh management mode command, a weak pattern detector that is activated according to a register update bit value included in the refresh management mode command and that outputs a risk level for each of the target rows, and a mode register circuit that updates at least one mode register value according to the risk level.

20 Claims, 10 Drawing Sheets

(56) References Cited

U.S. PATENT DOCUMENTS

| | | |
|---|---|---|
| 2014/0006703 A1 | 1/2014 | Bains et al. |
| 2015/0085594 A1 | 3/2015 | Dong et al. |
| 2015/0109871 A1 | 4/2015 | Bains et al. |
| 2021/0193218 A1 | 6/2021 | Lee |
| 2023/0101739 A1 | 3/2023 | You et al. |

\* cited by examiner

| | Any | H | L | L | L | H | H | H | L |
|---|---|---|---|---|---|---|---|---|---|
| REF (Per Bank, All Banks) | BG | | | BA0 | BA1 | BG0 | | SB0 | RU | |
| | 16B | × | BA0 | BA1 | BA2 | RFM | SB0 | | AB |
| | 8B | | BA0 | BA1 | BA2 | | RU | SB1 | |

FIG. 5A

| MR27 | RAAMULT | RAAIMT | | | RFM |
|---|---|---|---|---|---|
| MR57 | ARFM | RFMSBC | RFMSB | RAADEC | |

FIG. 5B

| Risk Level | RAAIMT | RAADEC | RAAMULT |
|---|---|---|---|
| Level A | RAAIMT-A | RAADEC-A | RAAMULT-A |
| Level B | RAAIMT-B | RAADEC-B | RAAMULT-B |
| Level C | RAAIMT-C | RAADEC-C | RAAMULT-C |
| Level D | RAAIMT-D | RAADEC-D | RAAMULT-D |

MEMORY DEVICE, MEMORY SYSTEM HAVING THE SAME AND METHOD OF OPERATING THE SAME

CROSS-REFERENCE TO RELATED APPLICATIONS

This application is a continuation application of U.S. application Ser. No. 17/724,942, filed on Apr. 20, 2022, which claims priority under 35 U.S.C. § 119 to Korean Patent Application No. 10-2021-0128452 filed on Sep. 29, 2021 in the Korean Intellectual Property Office, the disclosures of which are incorporated by reference herein in their entirety.

TECHNICAL FIELD

Embodiments of the present disclosure relate to a memory device. More particularly, embodiments of the present disclosure relate to a memory device, a memory system including the same, and a method of operating the same.

DISCUSSION OF THE RELATED ART

Electronic devices use memory to store data. Memory modules on the device may be volatile or non-volatile. Volatile memory devices lose their data when the device is powered down, and non-volatile memory devices maintain the data across power cycles. An example of a typical memory device is dynamic random access memory.

In general, dynamic random access memories (DRAMs) perform refresh operations to maintain stored data. For example, a DRAM may maintain data stored in a cell capacitor through a refresh operation. As the cell capacitor loses charge over time, there is a risk of data being changed or lost, which necessitates a periodic refresh operation that restores the charge in order to maintain data integrity.

DRAM technologies are in constant development. Many new developments have been made to decrease the physical size of the memory cells. Accordingly, the gap between cells of a DRAM is gradually narrowing. In addition, due to the reduction of the inter-cell spacing, interference by adjacent cells or wordlines is increasingly becoming an important data reliability factor. For example, highly integrated DRAM cells may be susceptible to row hammer operations or attacks, in which memory cell rows are repeatedly accessed, which can affect the data stored in adjacent rows. Even when the above-mentioned interference is concentrated on a specific cell, it may be difficult to restrict access to a specific address in a random access memory such as DRAM. Accordingly, disturbance may occur with respect to a specific cell, and the refresh characteristics of the cell may also be affected.

SUMMARY

Example embodiments provide a memory device for reducing row hammer disturbance, a memory system including the same, and a method of operating the same.

According to example embodiments, a memory device includes a memory cell array having a plurality of memory cells connected to wordlines and bitlines; a target row refresh logic configured to perform a refresh operation on at least one of target rows of the memory cell array in response to a refresh management mode command; a weak pattern detector that is activated according to a register update bit value included in the refresh management mode command and that outputs a risk level for the target rows; and a mode register circuit that updates at least one mode register value according to the risk level.

According to example embodiments, a method of operating a memory device includes monitoring target rows to determine a weak pattern; determining a register update bit value from a refresh management mode command; latching a risk level corresponding to the weak pattern according to the register update bit value; and setting mode register values related to a rolling accumulated ACT (RAA) value according to the risk level.

According to example embodiments, a memory system includes at least one memory device; and a memory controller controlling the at least one memory device. The memory controller includes a buffer memory storing a first value, a second value, and a third value; and a refresh circuit configured to count a rolling accumulated ACT (RAA) value for each of a plurality of target rows and to issue a refresh management mode command based on the RAA value, the first value, the second value, and the third value. The first value, the second value, and the third value are transmitted from the at least one memory device during a booting operation. The first value, the second value, and the third value are updated from the at least one memory device according to a register update bit value of the refresh management mode command.

BRIEF DESCRIPTION OF DRAWINGS

The above and other aspects and features of the present disclosure will be more clearly understood from the following detailed description, taken in conjunction with the accompanying drawings, in which:

FIG. 5A is a diagram illustrating that illustrates an example of an RFM command according to an example embodiment, and FIG. 5B is a diagram that illustrates an example of RAA-related registers according to an example embodiment;

DETAILED DESCRIPTION

Figure 1:
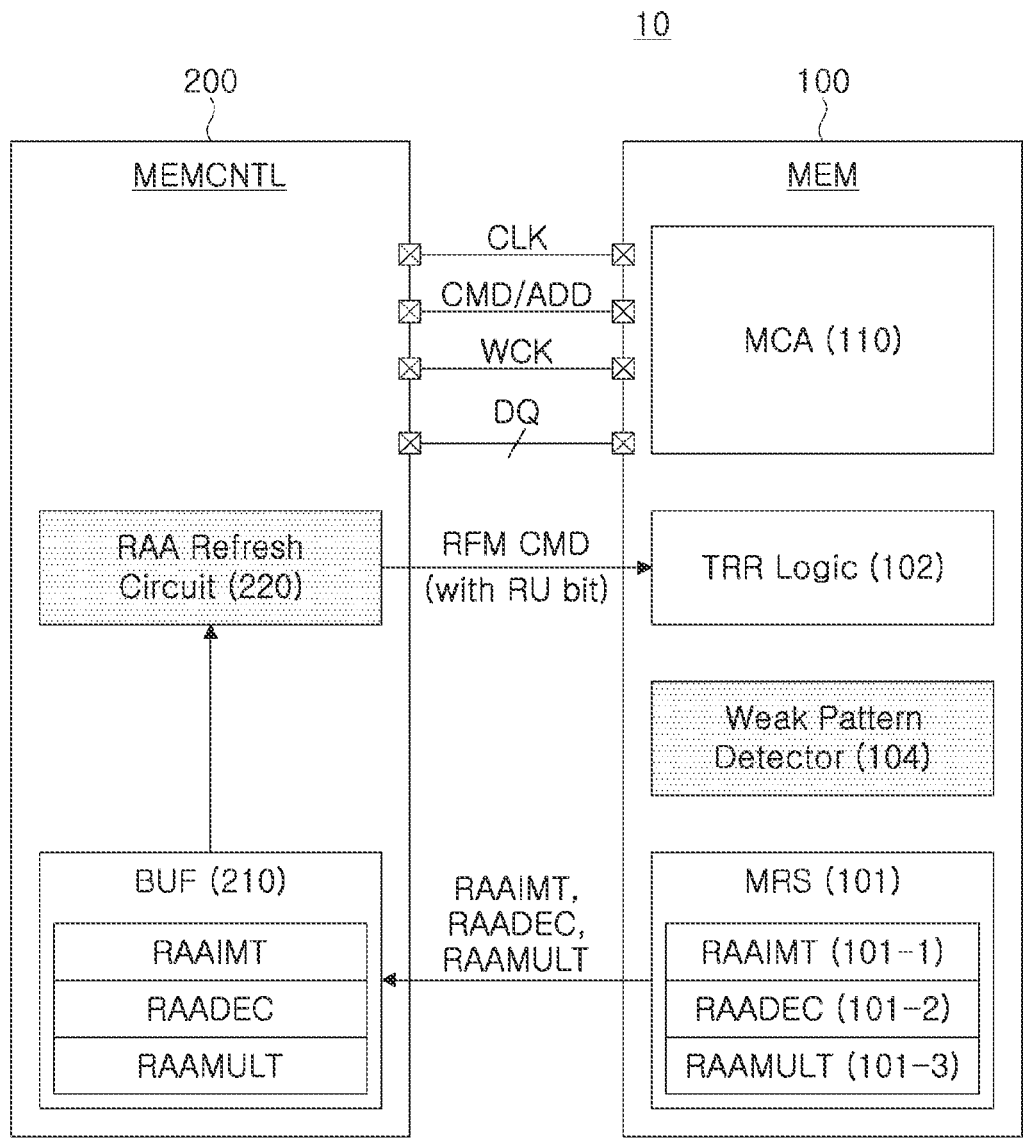
FIG. 1 is a diagram that illustrates a memory system 10 according to an example embodiment as an example.

Hereinafter, various embodiments will be described in detail with reference to the accompanying drawings Like reference symbols in the drawings may denote like elements, and to the extent that a description of an element has been omitted, it may be understood that the element is at least similar to corresponding elements that are described elsewhere in the specification.

In some cases, a selected wordline voltage is provided to a wordline selected in a read operation or a write operation. When this happens, the voltage of the wordline is increased even when the selected wordline voltage is not applied to adjacent wordlines due to the capacitive coupling effect. When the selected wordline is repeatedly accessed, charges may leak from memory cells corresponding to adjacent wordlines. This phenomenon for affecting the nearest wordline is called row hammer A technology for detecting a row hammer and performing a refresh operation is described in U.S. Pat. Nos. 9,087,602 and 10,446,216, which are incorporated by reference in this application. Embodiments of the present disclosure provide alternative technical features and details to mitigate the row hammer phenomenon.

FIG. 1 is a diagram that illustrates a memory system 10 according to an example embodiment. Referring to FIG. 1, the memory system 10 may include a memory device 100 (MEM) and a memory controller 200 (MEMCTRL) configured to control the memory device 100.

The memory system 10 may be included in a personal computer (PC) or a mobile electronic device. Examples of mobile electronic devices include laptop computers, mobile phones, smartphones, tablet PCs, personal digital assistants (PDAs), enterprise digital assistants (EDAs), digital still cameras, digital video cameras, Portable Multimedia Players (PMPs), Personal Navigation Devices or Portable Navigation Devices (PNDs), handheld game console, Mobile Internet Devices (MIDs), wearable computers, Internet of Things (IoT) devices, Internet of Everything (IoE) devices, or drones.

The memory device 100 may store data. In an example embodiment, the memory device 100 may be a volatile memory device. For example, the volatile memory device may be implemented as random access memory (RAM), dynamic RAM (DRAM), static RAM (SRAM), or low power double data rate (LPDDR) DRAM. In an example embodiment, the memory device 100 may be a non-volatile memory device. For example, the non-volatile memory device may be implemented as an Electrically Erasable Programmable Read-Only Memory (EEPROM), flash memory, Phase Change Random Access Memory (PRAM), Resistance Random Access Memory (RRAM), Nano Floating Gate Memory (NFGM), Polymer Random Access Memory (PoRAM), Magnetic Random Access Memory (MRAM), or Ferroelectric Random Access Memory (FRAM).

Referring back to FIG. 1, the memory device 100 may include a mode register circuit 101 (MRS), a target row refresh logic (TRR Logic) 102, a weak pattern detector 104, and a memory cell array (MCA) 110.

The mode register circuit 101 may include a plurality of mode registers that store values for setting an operation mode. For example, the mode register circuit 101 may include a first mode register 101-1, a second mode register 101-2, and a third mode register 101-3 for performing a refresh operation on a target row.

The first mode register 101-1 may store a reference value (RAAIMT, a first value) for comparing Rolling Accumulated ACT (RAA) values. In this case, the RAA value refers to the actual number of ACTs (or Activations) measured by the system (controller) for the target row. For example, RAAIMT is a threshold value for issuing a Refresh Management Mode (RFM) command. For example, the controller 200 may issue the RFM command when the RAA value for the target row is greater than RAAIMT.

The second mode register 101-2 may store a minimum value (RAADEC, a second value) used for decreasing the RAA value stored after the RFM command is issued. RAADEC is a minimum value by which the RAA value is reduced when the RFM command is issued once. In an example embodiment, the RAA value may be decreased by RAAIMT×RAADEC after issuing the RFM command.

The third mode register 101-3 may store a value (RAAMULT, a third value) that is used to determine a maximum value RAAMMT of the RAA value. RAAMULT is a parameter that determines by how many times the RAADEC is reduced, when the REF command is issued once. In this case, the maximum value (RAAMMT) of the RAA value is RAAIMT×RAAMULT.

In an example embodiment, RAAIMT, RAADEC, and RAAMULT may be determined by training during an initialization operation of the memory device 100. For example, in a training phase, RAAIMT, RAADEC, and RAAMULT may be determined by measuring a failure rate of the cell, row, and/or the entire memory device 100, and may be set so as to reduce the failure rate to an acceptable level. In an embodiment, RAAIMT, RAADEC, and RAAMULT may be updated in real time in response to RFM commands. For example, RAAIMT, RAADEC, and RAAMULT may be determined according to a risk level. In this case, the risk level may be output from the weak pattern detector 104.

The target row refresh logic (TRR logic) 102 may perform a refresh operation on the target row in response to the RFM command. The target row refresh logic 102 may perform an access count operation or an ACT count operation on the target row, and store the access count value or the ACT count value. When the access count value or the ACT count value reaches a predetermined value, the target row refresh logic 102 may perform a refresh operation on the corresponding target row and reset the access count value or the ACT count value.

The weak pattern detector 104 may determine and output a risk level for a target row using an access count value or an ACT count value. The weak pattern detector 104 may be activated according to a specific bit (RU bit) of the RFM command. For example, according to the measurement bit of the RFM command, the weak pattern detector 104 may output a risk level (or a degree of risk) for the row hammer RAAIMT, RAADEC, and RAAMULT may be updated according to this risk level. In an example embodiment, a warning signal according to this risk level may be output to the memory controller 200.

In some embodiments, the target row refresh logic 102 and the weak pattern detector 104 are implemented as separate chips dedicated to the refresh operation.

The memory cell array MCA 110 may include a plurality of memory banks. Each of the plurality of memory banks may include a plurality of memory cells connected to wordlines and bitlines.

The memory device 100 may receive a refresh command from the memory controller 200 after the memory device outputs a warning signal. The memory device 100 may perform a refresh operation in response to a refresh command from the memory controller 200. For example, the refresh operation may be continuously performed on wordlines adjacent to a wordline on which disturbance is concentrated. The memory device 100 may perform the refresh operation on a corresponding wordline in response to a refresh command from the memory controller 200. In some embodiments, after outputting a warning signal to the outside, the memory device 100 may perform a refresh operation on its own without receiving a refresh command from the memory controller 200.

The memory controller 200 may be configured to control the memory device 100, to read data stored in the memory device 100, and/or write data to the memory device 100. The memory controller 200 may control a write operation or a read operation on the memory device 100 by providing a command CMD and an address ADDR to the memory device 100 in synchronization with a clock signal CLK. Also, data input/output through data lines DQ may be transmitted/received between the memory controller 200 and the memory device 100 in synchronization with a data transmission clock WCK.

The memory controller 200 may provide an interface between a host and the memory device 100. The memory controller 200 may exchange data and signals with the memory device 100 through control signal lines /RAS, /CAS and /WE, an address line ADD, data lines DQ, and a warning signal line. For example, the memory controller 200 may transmit a refresh command with reference to a warning signal provided from the memory device 100. For example, when the warning signal output from the memory device 100 is activated, the memory controller 200 may transmit an auto refresh command set based on control signals (e.g., /RAS, /CAS, /WE) to the memory device 100.

As illustrated in FIG. 1, the memory controller 200 may issue an RFM command according to the RAA value. The memory controller 200 may include an RAA refresh circuit 220 and a buffer memory 210.

The RAA refresh circuit 220 may store and manage RAA values for a plurality of target rows. The RAA refresh circuit 220 may issue an RFM command according to the RAA value, and may use RAAIMT, RAADEC, and RAAMULT for the target row. In this case, the RFM command may include a specific bit (RU bit) that instructs the memory device 100 to change the stored values RAAIMT, RAADEC, and RAAMULT of the mode register circuit 101 of the memory device 100.

The buffer memory 210 (BUF) may receive and store RAAIMT, RAADEC, and RAAMULT from the memory device 100.

The trend of miniaturized memory has caused recent memory devices to decrease in size, such that the size of the cell capacitor decreases and the amount of power storage decreases. As a result, the durability of the cell has reduced, and the possibility of data loss due to current leakage is also increasing. In addition, as cell data contamination issues such as row hammer also increase, the reliance on refresh operations for the memory is increasing. In comparative semiconductor devices, a memory device performs additional refresh by adding a refresh management mode (RFM) function to an existing refresh operation, by using an RFM command at a time point that is configured by the system. The timing of providing the RFM in the comparative example is determined by controlling the RAA value of the memory controller based on values such as RAAIMT, RAADEC, and RAAMULT stored in the memory device. However, this RFM method is difficult to flexibly cope with various attack patterns.

The memory system 10 according to an example embodiment of the present inventive concept includes the memory device 100 which outputs a risk level corresponding to a weak pattern in response to the RFM command and updates the values of RAAIMT, RAADEC, and RAAMULT in real time according to the output risk level, and accordingly, may appropriately cope with various attack patterns.

Figure 2:
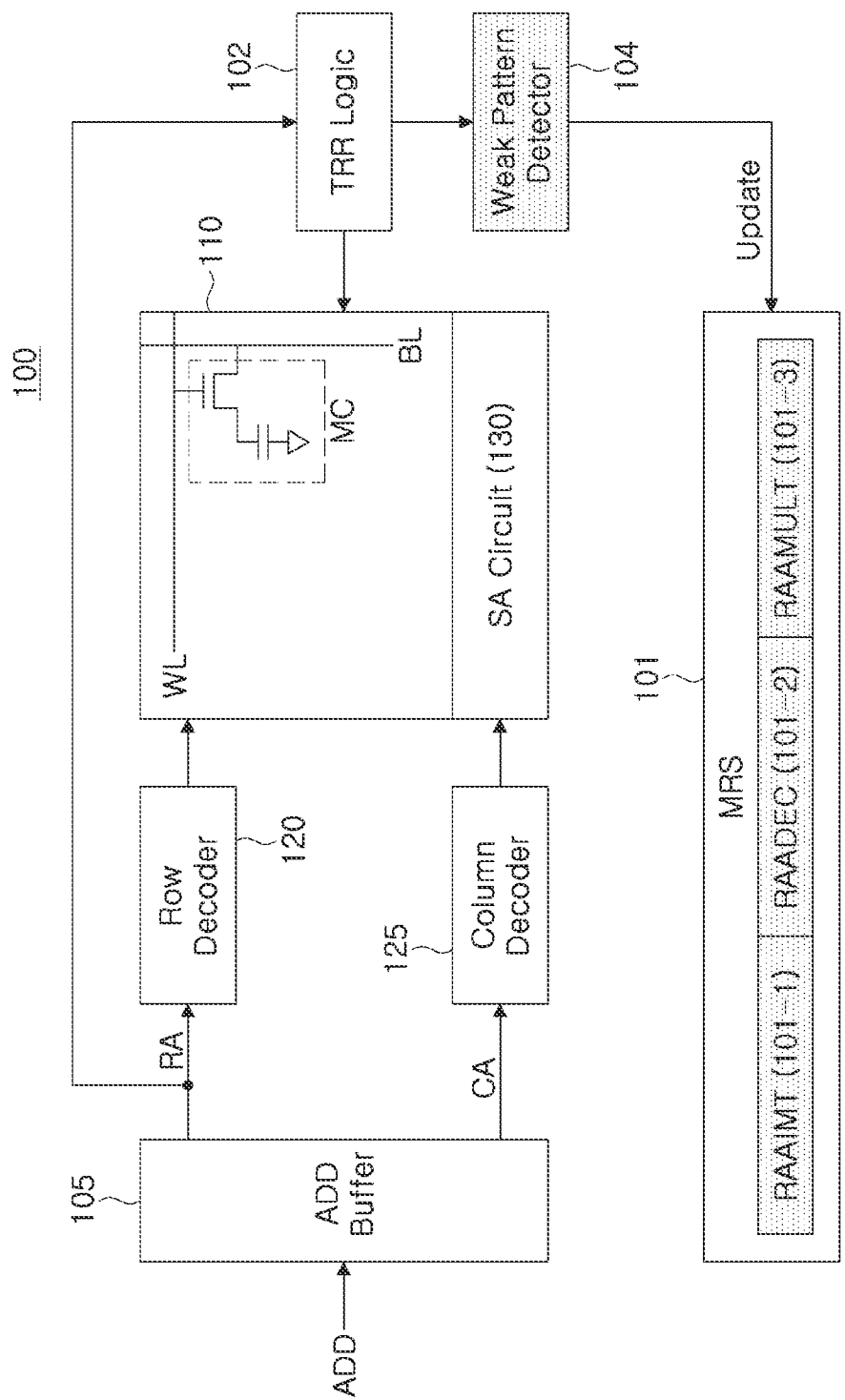
FIG. 2 is a diagram that illustrates a memory device 100 according to an example embodiment as an example.

FIG. 2 is a diagram that illustrates an example of the memory device 100 according to an example embodiment. Referring to FIG. 2, the memory device 100 may include the mode register circuit 101, the TRR logic 102, the weak pattern detector 104, an address buffer 105, the memory cell array 110, a row decoder 120, a column decoder 125, and a sense amplifier circuit 130.

The mode register circuit 101 may include the first mode register 101-1 which stores the first value RAAIMT, the second mode register 101-2 which stores the second value RAADEC, and the third mode register 101-3 which stores the third value RAAMULT. In an example embodiment, the first value RAAIMT, the second value RAADEC, and the third value RAAMULT may be set according to a training operation of the initialization operation. In an embodiment, the first value RAAIMT, the second value RAADEC, and the third value RAAMULT may be updated according to a risk level determined in response to the RFM command.

In an example embodiment, the first mode register and the second mode register may be the same register. For example, the first value RAAIMT and the second value RAADEC may be stored in the same mode register.

The TRR logic 102 may include first registers that store addresses indicating a plurality of target rows, at least one counter which performs an access count or an ACT (or Activation) count corresponding to each of the addresses, and second registers that store corresponding access count values.

In an example embodiment, the TRR logic 102 may be activated in response to an RFM command. For example, the TRR logic 102 may perform a refresh operation on at least one target row in response to an RFM command. The TRR logic may be implemented as its own circuit, or may be incorporated into another piece of hardware such as a processor.

The weak pattern detector 104 may output a risk level, such as a risk level related to a row hammer, based on the access count or the ACT count according to a specific bit (RU bit) of the RFM command. In an example embodiment, the risk level may be determined according to an access count value for any one target row. In an embodiment, the risk level may be determined according to all ACT (or Activation) count values for the target row.

The address buffer 105 may temporarily store the address ADD received from the memory controller 200. In this case, the received address ADD may include a row address RA and a column address CA.

The memory cell array 110 may include a plurality of bank arrays. Each of the bank arrays may include a plurality of memory cells MC formed at intersections of a plurality of wordlines WL and a plurality of bitlines BL. As illustrated in FIG. 2, each of the plurality of respective memory cells may be implemented with a selection transistor and a capacitor.

The row decoder 120 may receive the row address RA, decode the row address RA, and activate a wordline corresponding to the row address RA. For example, the activated row decoder may select a wordline corresponding to the row address RA and apply a wordline voltage to the selected wordline.

The column decoder 125 may receive the column address CA, select bitlines corresponding to the column address CA, and connect sense amplifiers corresponding to the selected bitlines.

The sense amplifier circuit 130 may include a plurality of sense amplifiers connected to a plurality of bitlines. Each of the plurality of sense amplifiers may sense data corresponding to a bitline. For example, each of the sense amplifiers may be connected to a bitline and a complementary bitline. Each of the plurality of sense amplifiers may write data to a memory cell connected to the selected bitline or sense data stored in the memory cell connected to the selected bitline. Also, each of the plurality of sense amplifiers may rewrite data stored in the memory cell in a refresh operation.

Figure 3:
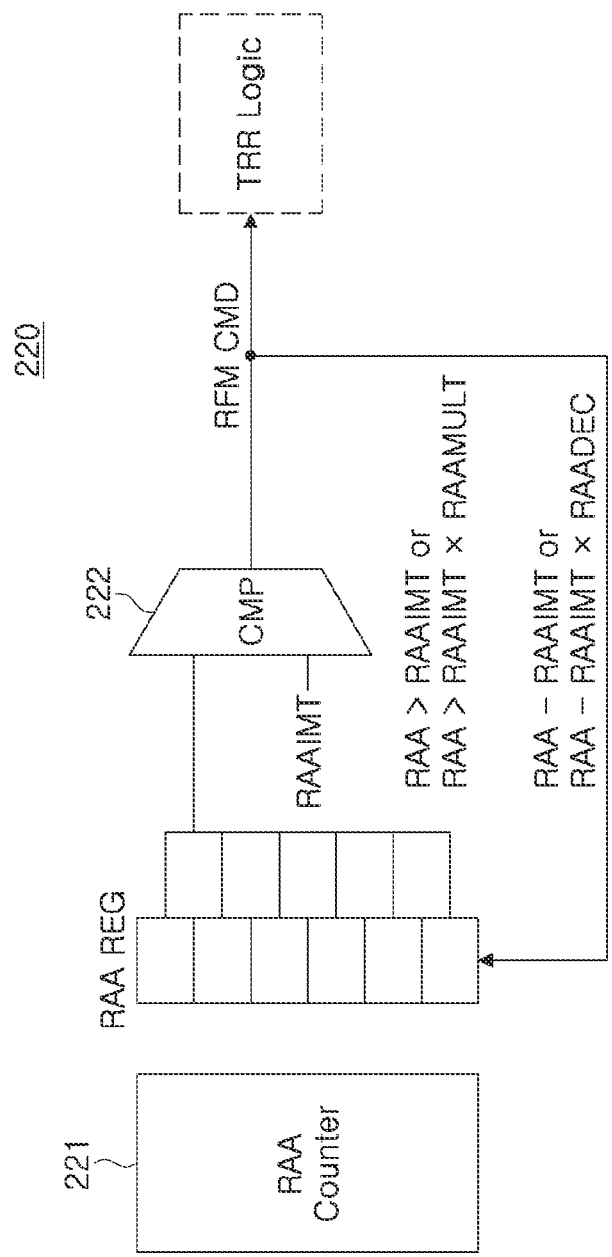
FIG. 3 is a diagram that illustrates an operation of an RAA refresh circuit 220 of a memory controller 200 according to an example embodiment.

FIG. 3 is a diagram that illustrates an operation of the RAA refresh circuit 220 of the memory controller 200 according to an example embodiment.

The buffer memory 210 of the memory controller 200 (referring to FIG. 1) may include registers which each correspond to each of a plurality of target rows and which store a rolling accumulated ACT (RAA) value. An RAA counter 221 of the RAA refresh circuit 220 may increase the RAA value of the ACT bank by 1 during an ACT. The RAA value may be stored in the corresponding register. A comparator CMP 222 may output the RFM command when the RAA value stored in the register corresponding to the target row is greater than RAAIMT. In this case, the RFM command may be transmitted to the TRR logic 102 of the memory device 100. When the RFM command is issued, the RAA refresh circuit 200 may decrease the RAA value corresponding to the target row by RAAIMT or RAAIMT× RAADEC. The reduced RAA value may be stored in a corresponding register.

If the corresponding RAA value of the target row reaches a maximum value (RAAMMT=RAAIMT*RAAMULT), the RAA refresh circuit 220 does not perform any further ACTs and issues an RFM command, and may transmit the issued RFM command to the TRR logic 102 of the memory device 100. Since the RFM command may be postponed during operation, the RAA value stored in the register may be greater than the RAAIMT.

The memory controller 200 may read and store RAAIMT, RAADEC, and RAAMULT of the memory device 100 when the system is booted. The RAA refresh circuit 220 may use the stored RAAIMT, RAADEC, and RAAMULT for RAA operation. By adding a register update bit (RU bit) to the RFM command, the memory controller 200 may update the RAAIMT, RAADEC, and RAAMULT inside the memory device 100 according to the risk level, in real time.

Figure 4A:
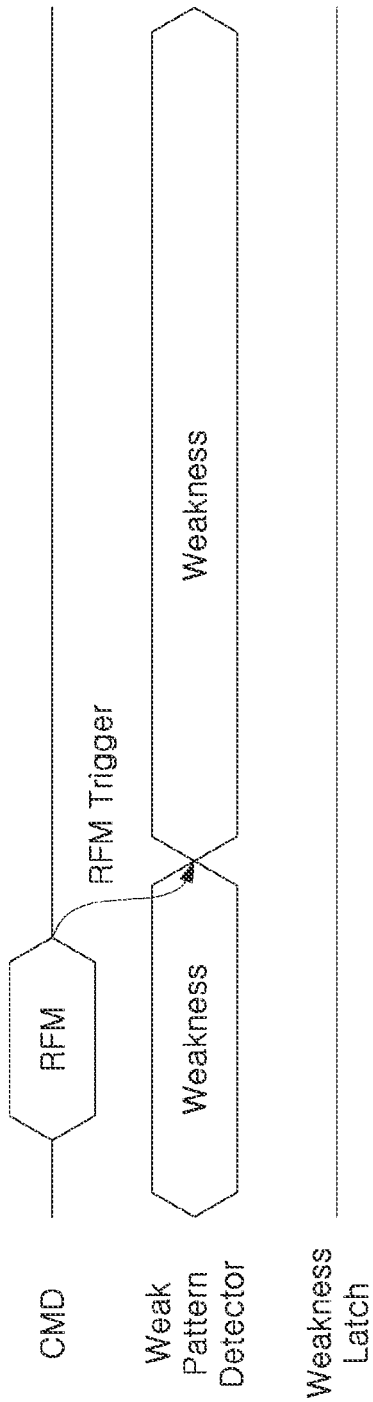
FIGS. 4A and 4B are diagrams that illustrate an example of an operation according to an RFM command of the memory device 100 according to an example embodiment.
Figure 4B:
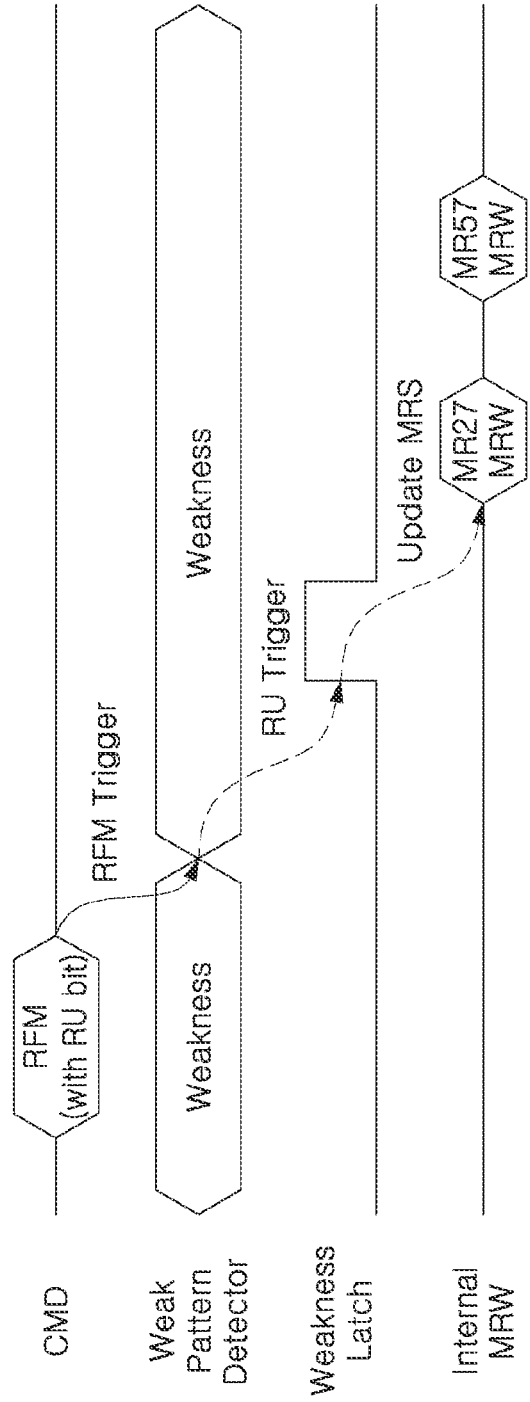

FIGS. 4A and 4B are diagrams that illustrate an example of an operation according to an RFM command of the memory device 100 according to an example embodiment.

As illustrated in FIG. 4A, the memory device 100 may receive the RFM command without the RU bit. In response to the RFM command, the TRR logic 102 of the memory device 100 may be executed. Accordingly, refresh operation may be performed on weak target rows by the TRR logic. The system may perform an RAA-related operation by itself and decrease the RAA value.

As illustrated in FIG. 4B, the memory device 100 may receive an RFM command having an RU bit. In response to the RFM command, the TRR logic 102 may be executed. At the same time, according to the RU bit, the memory device 100 may change the RAA-related internal register values RAAIMT, RAADEC, and RAAMULT by itself and update the changed values. For example, the weak pattern detector 104 may be activated according to the RU bit. A risk level for the row hammer may be determined by the weak pattern detector 104. Mode registers (e.g., MR27 and MR57) may be internally reset according to the determined risk level. For example, the RAA-related register value may be changed based on the risk level.

In some embodiments, RAA-related register values may be changed based on the status of various memory devices. For example, the RAA-related register value may be changed according to the PVT (Process, Voltage and Temperature) variation.

The memory controller 200 may read the updated registers and then perform the RAA operation based on the changed register.

When an embodiment includes a dedicated memory device to measure risk level, the memory system 10 according to an example embodiment may perform an appropriate refresh operation on the memory device by performing the RAA operation based on the memory device that measures the risk level of the row hammer by itself. In addition, the memory system 10 according to an example embodiment may flexibly respond to various attack patterns because the weak pattern detector 102 of the memory device 100 may be variously implemented. For example, the memory system 10 may optimize the RFM operation itself for the memory device 100 by setting only one RU bit.

FIG. 5A is a diagram that illustrates an example of an RFM command according to an example embodiment, and FIG. 5B is a diagram that illustrates an example of RAA-related registers according to an example embodiment.

Referring to FIG. 5A, the RFM command may be implemented by setting a specific bit as the RFM bit in the existing refresh command REF. In an example embodiment, the RFM command may include a register update bit (RU bit). It should be understood that the RFM command illustrated in FIG. 5A is merely an example embodiment. The RFM command in an embodiment of the present inventive concept may include the RU bit and may include information instructing refresh on the target address.

Referring to FIG. 5B, the mode register MR27 may store RAAMULT and RAAIMT. In this case, RAAMULT and RAAIMT may be stored when the system is booted, may be updated according to the level of risk detected by the weak pattern detector 104, and/or may be updated according to a dedicated memory for measuring the risk level. The mode register MR57 may store RAADEC. In this case, the RAADEC may be stored when the system is booted or may be updated according to the level of risk detected by the weak pattern detector 104.

Figures 6, 7:
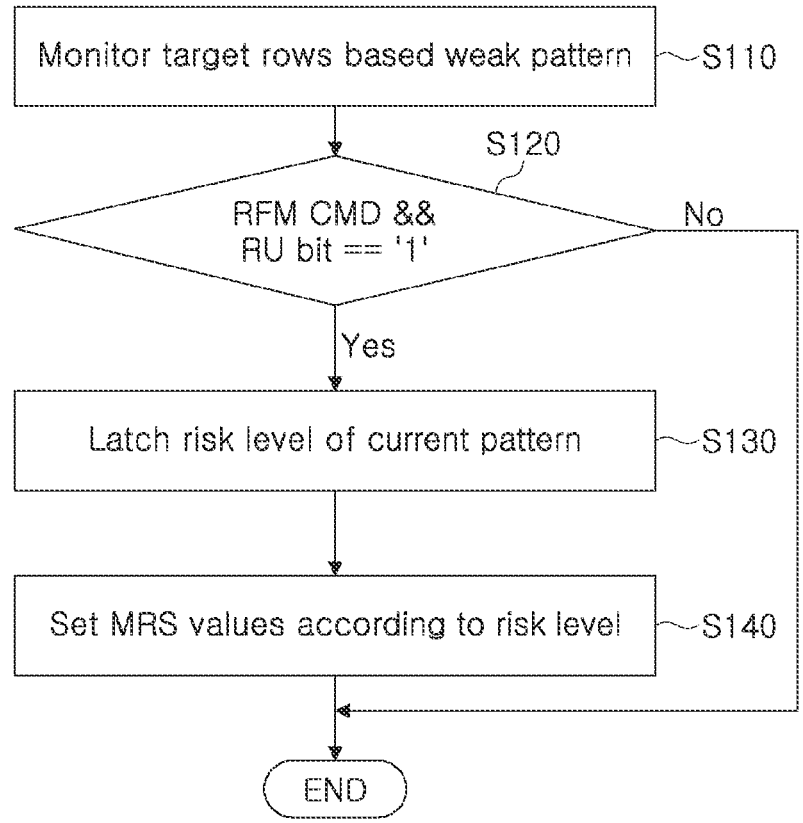
FIG. 6 is a flowchart that illustrates an example of a method of operating the memory device 100 according to an example embodiment.
FIG. 7 is a diagram that illustrates risk levels related to row hammer of the memory device 100 and mode register settings accordingly according to an example embodiment.

FIG. 6 is a flowchart that illustrates an example of a method of operating the memory device 100 according to an example embodiment. Referring to FIGS. 1 to 6, the memory device 100 may operate as follows.

The memory device 100 may monitor target rows based on the weak pattern (S110). The memory device 100 may periodically or aperiodically receive an RFM command from an external device (e.g., the memory controller 200 illustrated in FIG. 1). The memory device 100 receives the RFM command and may determine whether the RU bit of the received RFM command is set to '1' (S120). For example, when the RU bit of the received RFM command is '1', the memory device 100 may detect the risk level for the current pattern on the target rows, and may latch the detected risk level (S130). The memory device 100 may set RAA-related MRS values (e.g., RAAIMT, RAADEC, and RAAMULT) according to the latched risk level (S140). Thereafter, the memory device 100 may output the set MRS values, based on the request of the external device. When the RU bit of the received RFM command is not '1', the memory device 100 may interpret the RFM command as described above in an automatic process, or may return to monitoring the target rows.

FIG. 7 is a diagram that illustrates row hammer-related risk levels of the memory device 100 according to an example embodiment, and mode register settings accordingly.

Referring to FIG. 7, when the risk level is 'A', RAAIMT may be set to RAAIMT-A, RAADEC may be set to RAADEC-A, and RAAMULT may be set to RAAMULT-A. When the risk level is 'B', RAAIMT may be set to RAAIMT-B, RAADEC may be set to RAADEC-B, and RAAMULT may be set to RAAMULT-B. When the risk level is 'C', RAAIMT may be set to RAAIMT-C, RAADEC may be set to RAADEC-C, and RAAMULT may be set to RAAMULT-C. When the risk level is 'D', RAAIMT may be set to RAAIMT-D, RAADEC may be set to RAADEC-D, and RAAMULT may be set to RAAMULT-D.

Register values (RAAIMT-A, RAADEC-A, RAAMULT-A, RAAIMT-B, RAADEC-B, RAAMULT-B, RAAIMT-C, RAADEC-C, RAAMULT-C, RAAIMT-D, RAADEC-D and RAAMULT-D) utilized for these settings may be stored in the memory device 100 in the form of an anti-fuse or a fuse. Although the number of risk levels illustrated in FIG. 7 is 4, it should be understood that embodiments of the present inventive concept are not limited thereto.

Figure 8A:
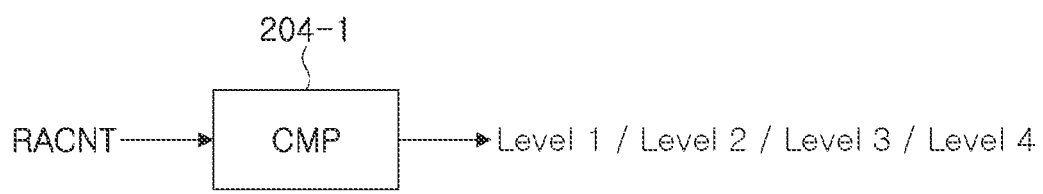
FIGS. 8A and 8B are diagrams that illustrate examples of a weak pattern detector according to an example embodiment.
Figure 8B:
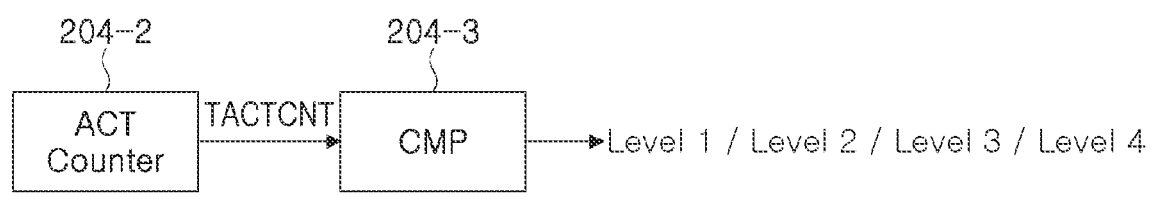

FIGS. 8A and 8B are diagrams that illustrate examples of a weak pattern detector according to an example embodiment.

Referring to FIG. 8A, a weak pattern detector 204 may include a comparator 204-1. The comparator 204-1 may determine the risk level according to an access count value RACNT of the target row.

Referring to FIG. 8B, a weak pattern detector 204*a* may include an ACT counter 204-2 for total ACT counting, and a comparator 204-3. The ACT counter 204-2 may output a total ACT count value TACTCNT for the target rows. The comparator 204-3 may determine the risk level according to the total ACT count value TACTCNT.

Figure 9:
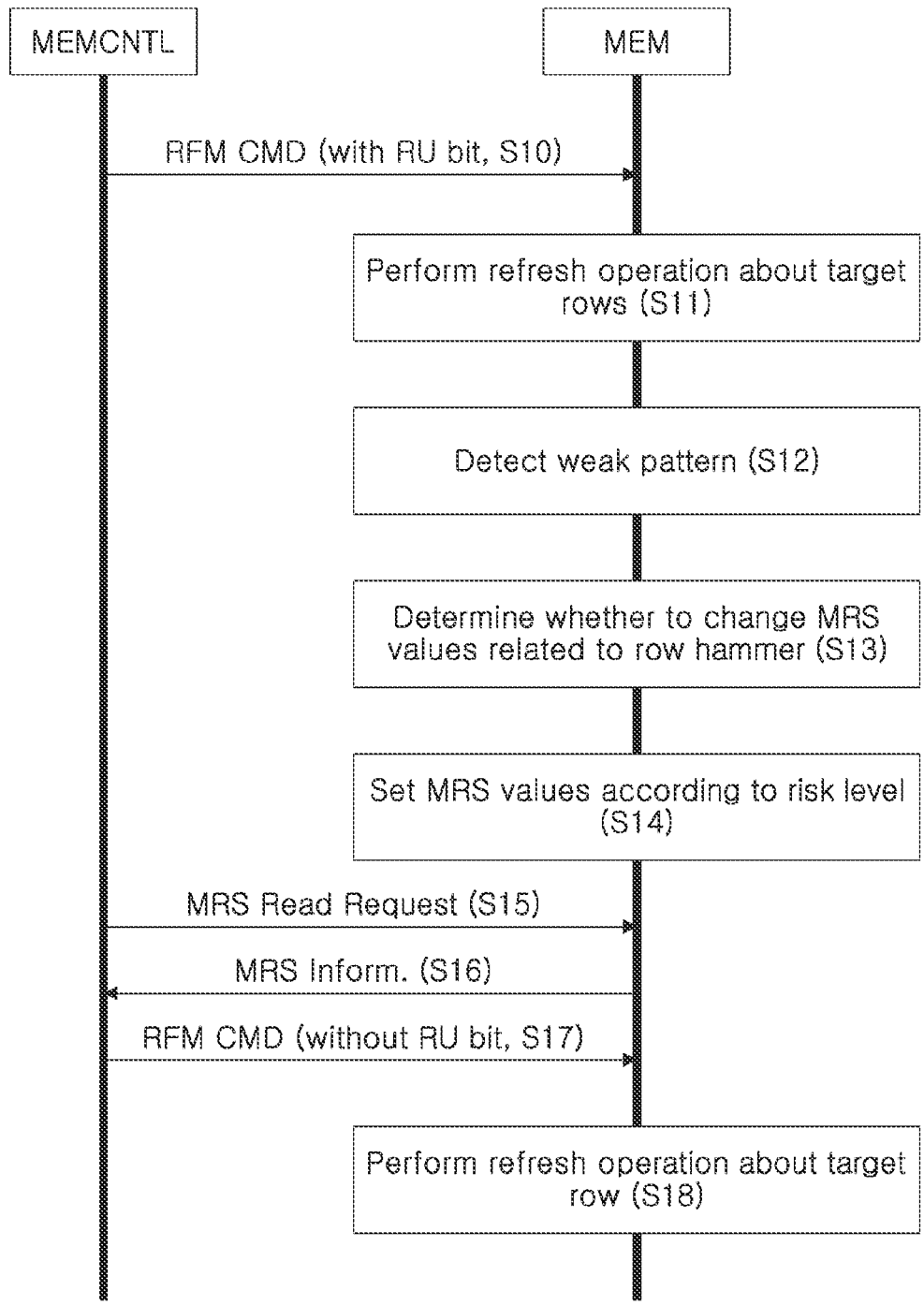
FIG. 9 is a ladder diagram that illustrates an example of a refresh operation of a memory system according to an example embodiment.

FIG. 9 is a ladder diagram (sometimes referred to as a swim diagram) that illustrates an example of a refresh operation of a memory system according to an example embodiment.

Referring to FIG. 9, the memory controller MEMCNTL may issue an RFM command for performing a row hammer-related refresh operation, and transmit the issued RFM command to the memory device MEM (S10). In this case, the RFM command may include an RU bit indicating a register update. In an example embodiment, the memory controller MEMCNTL may issue an RFM command according to an internal policy, such as, for example, based on elapsed time or memory operation metrics.

The memory device MEM may receive the RFM command and perform a refresh operation on at least one target row in response to the received RFM command (S11). Thereafter, the memory device MEM may detect a weak pattern in response to the RU bit of the RFM command (S12). A risk level for the row hammer may be determined according to the detected weak pattern. The memory device MEM may determine whether to set the row hammer related MRS values according to the determined risk level (S13). For example, when it is necessary to change the MRS values according to the risk level, the memory device MEM may set the MRS values according to the risk level (S14).

Thereafter, the memory controller MEMCNTL may transmit a read request for the MRS value to the memory device MEM (S15). The memory device MEM may output the row hammer related MRS values to the memory controller MEMCNTL in response to the read request (S16).

Thereafter, the memory controller MEMCNTL may issue an RFM command using the new MRS values and transmit the issued RFM command to the memory device MEM (S17). In this example, the RFM command may not include the RU bit. When the RFM command doesn't include the RU bit, the RFM command may not instruct a register update. The memory device MEM may perform a refresh operation on target rows in response to the received RFM command (S18).

Figure 10:
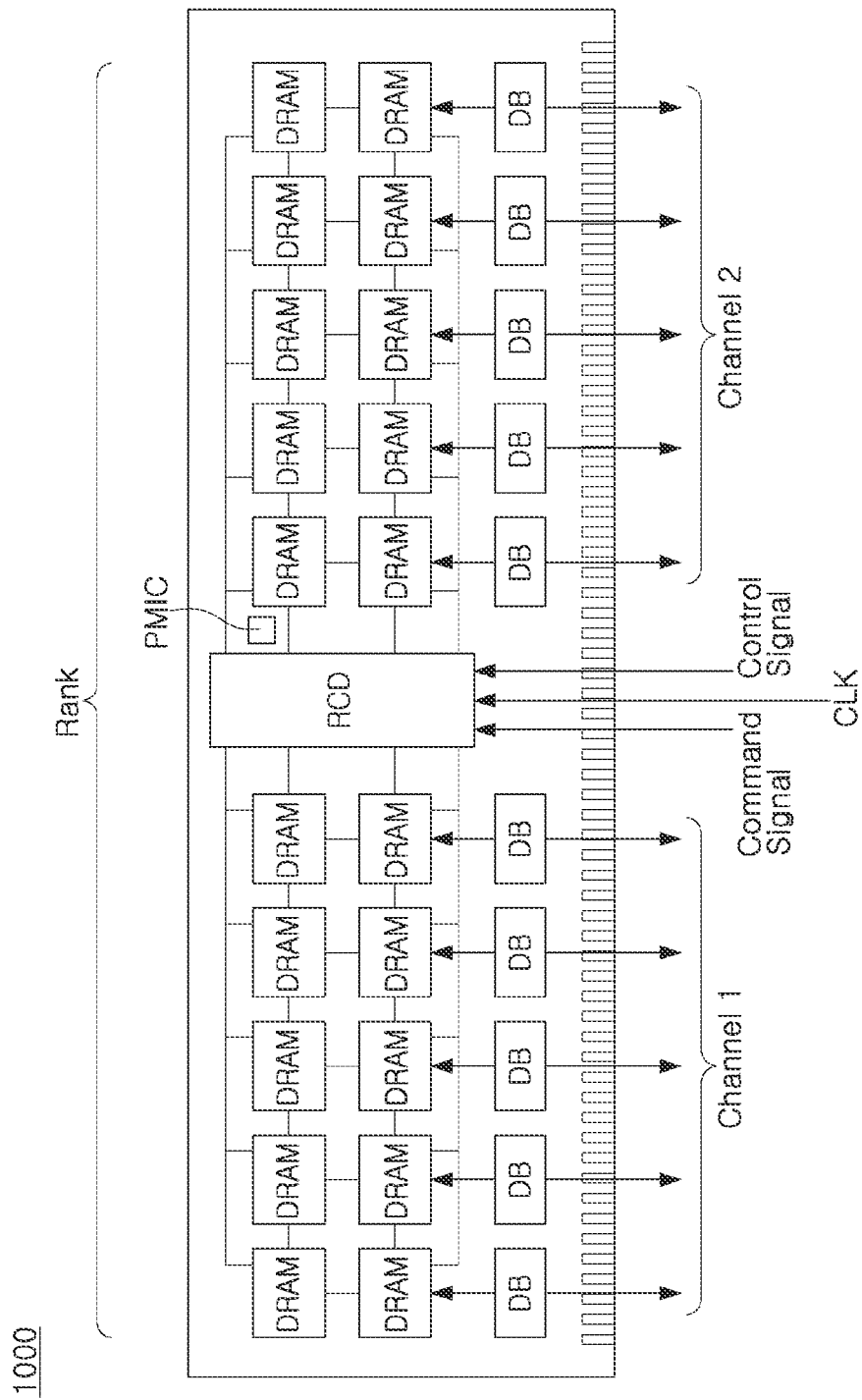
FIG. 10 is a diagram that illustrates an example of a memory module 1000 according to an example embodiment.

FIG. 10 is a diagram that illustrates an example of a memory module 1000 according to an example embodiment. Referring to FIG. 10, the memory module 1000 may include a plurality of memory chips (DRAMs) which each include a memory cell array. The memory module 1000 may further include a buffer chip (RCD) for routing transmission/receiving signals with the memory controller and/or managing memory operations for the memory chips, and a power management chip (PMIC). For example, according to an example embodiment, the buffer chip (RCD) may control the transmission and reception of signals with the memory controller and/or may manage memory operations for the memory chips. Each of the plurality of memory chips may detect a risk level of the memory device as described with reference to FIGS. 1 to 9, update row hammer-related register values in real time according to the detected risk level, and perform a refresh operation on target rows according to the updated register value.

The RCD may control the memory chips (DRAM) and the power management chip (PMIC) under the control of the memory controller. For example, the RCD may receive a command signal, a control signal, and a clock signal from the memory controller. The memory chips DRAMs are each respectively connected to a corresponding data buffer among the data buffers DB through a corresponding data transmission line to transmit and receive a data signal DQ and a data strobe signal DQS. The memory chips DRAMs are respectively connected to the data buffer DB through corresponding data transmission lines to transmit and receive parity data PRT and a data strobe signal DQS.

An SPD chip may be a programmable read-only memory (EEPROM). The SPD chip may include initial information or device information of the memory module 1000. For example, the SPD chip 580 may include initial information or device information such as a module form, module configuration, storage capacity, module type, and execution environment of the memory module 500. When the memory system including the memory module 1000 is booted, the memory controller may read device information from the SPD chip and recognize the memory module based on the read device information.

In an example embodiment, the rank may include 8 bank groups. Each of the bank groups may include four banks. In an example embodiment, the memory chips may be divided into first channel-only memory chips and second channel-only memory chips.

The memory controller transmits a command to each channel of the memory chip (DRAM). Each channel has an independent command, address, and bus to operate in parallel with each other. One channel has one or more ranks, and each rank has an independent DRAM device. In addition, all ranks in the channel perform operations in parallel. Each rank has a plurality of banks, and DRAM cells are provided in a two-dimensional array in the banks. Respective banks are operable in parallel.

Figure 11:
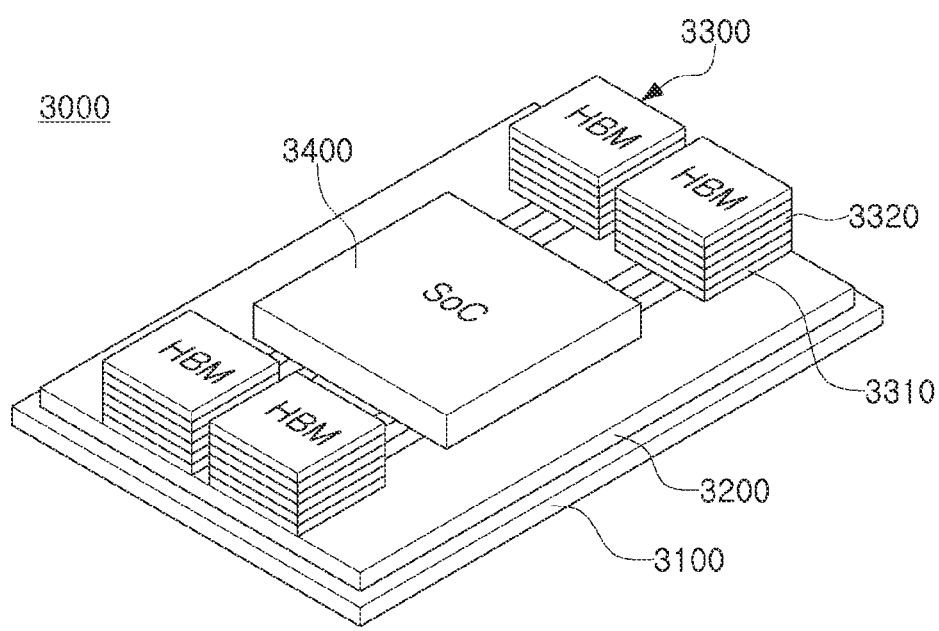
FIG. 11 is a diagram that illustrates a semiconductor package including a stack semiconductor chip according to an example embodiment.

FIG. 11 is a diagram that illustrates a semiconductor package including a stack semiconductor chip according to an example embodiment. Referring to FIG. 11, a semiconductor package 3000 may be a memory module including at least one stack semiconductor chip 3300 and a system-on-chip (SOC) 3400 mounted on a package substrate 3100 such as a printed circuit board. An interposer 3200 may be optionally further provided on the package substrate 3100. The stack semiconductor chip 3300 may be formed in the Chip-on-Chip (CoC) structure.

The stack semiconductor chip 3300 may include at least one memory chip 3320 stacked on a buffer chip 3310 such as a logic chip. The memory chip 3320 may update RAA value-related mode register values in real time as described with reference to FIGS. 1 to 10.

The buffer chip 3310 and the at least one memory chip 3320 may be connected to each other by a through silicon via (TSV). The buffer chip 3320 may perform a training operation on the memory chip 3320. The stack semiconductor chip 3300 may be a high bandwidth memory (HBM).

The memory system according to an example embodiment may be optimized to the operation of the semiconductor package by internally changing RAAIMT, RAADEC, and RAAMULT, which are in charge of the refresh management activation cycle, in the DRAM.

The memory system according to an example embodiment of the present inventive concept may include a circuit for recognizing and triggering the RU bit. The memory device according to an embodiment of the present inventive concept may include a target row refresh (TRR) circuit, a circuit for detecting a weak pattern by referring to the operation of the TRR circuit, a circuit for determining the risk of the pattern, and a circuit for setting/writing an appropriate register value according to the degree of risk. In an example embodiment, the period at which the RFM command is generated may be adjusted to match the DRAM operation. In an example embodiment, the RFM may be adjusted in various manners according to a weak pattern selection method, thereby flexibly responding to various attack patterns.

In the memory system according to an example embodiment, DRAM may be optimized only by setting one RU bit during RFM. Unlike RFMs of a comparative example, the memory system according to an example embodiment of the present inventive concept selects a weak pattern from the viewpoint of DRAM operation and adjusts the RFM period, and thus, DRAM-optimized operation is possible. In an example embodiment, the weak pattern selection method may be diversified, thereby flexibly coping with various patterns. As set forth above, a memory device, a memory system including the same, and a method of operating the same according to an example embodiment, may prevent a row hammer attack by dynamically setting Rolling Accumulated ACT (RAA)-related register values.

In addition, a memory device, a memory system including the same, and a method of operating the same according to an example embodiment, may increase data reliability by preventing a row hammer attack.

While example embodiments have been illustrated and described above, it will be apparent to those skilled in the art that modifications and variations could be made without departing from the scope of the present disclosure as defined by the appended claims.

What is claimed is:

1. An operating method of a memory device comprising:
receiving a Refresh Management Mode (RFM) command with a register update bit from an external device;
latching weakness information by a weak pattern detector in response to the register update bit; and
updating at least one of a first value in a first mode register and a second value in a second mode register in response to an internal command,
wherein the first value and the second value correspond to the weakness information.

2. The operating method of claim 1,
wherein the RFM command is periodically or aperiodically received from the external device.

3. The operating method of claim 1,
wherein the weakness information includes a risk level for current pattern on at least one of target rows.

4. The operating method of claim 3, further comprising:
determining the risk level based on access count values of the target rows by the weak pattern detector.

5. The operating method of claim 3, further comprising:
determining the risk level based on activations (ACT) count values of the target rows by the weak pattern detector.

6. The operating method of claim 3, further comprising:
determining the risk level based on a measure of Process, Voltage and Temperature (PVT) variations by the weak pattern detector.

7. The operating method of claim 1,
wherein the first value is used for rolling accumulated activation (RAA) values for each of the target rows and is compared to a threshold value to issue the RFM command, and
wherein the second value is used to determine a reduction amount of the RAA value after issuing the RFM command.

8. The operating method of claim 7, further comprising:
storing a third value of a third mode register in an initialization operation,
wherein the third value is used to determine a maximum value of the RAA value RAAMULT.

9. The operating method of claim 1, further comprising:
internally resetting the first value and the second value according to a risk level for a row hammer.

10. The operating method of claim 1, further comprising:
performing a refresh operation on at least one of the target rows; and
changing the weakness information by the weak pattern detector after the refresh operation.

11. A memory device comprising:
a memory cell array having a plurality of memory cells connected wordlines and bitlines;
a target row refresh logic configured to perform a refresh operation on at least one of target rows of the memory cell array in response to a RFM (Refresh Management Mode) command with a register update bit from a controller;
a first mode register configured to store a first value;
a second mode register configured to store a second value; and
a weak pattern detector configured to receive the RFM command, and latch weakness information in response to the register update bit,
wherein at least one of the first value and the second value is updated in response to an internal command,
wherein the first value and the second value are correspond to the weakness information.

12. The memory device of claim 11, further comprising:
a third mode register configured to store a third value in an initialization operation.

13. The memory device of claim 12,
wherein the weakness information includes a risk level for a current pattern on at least one of target rows,
wherein the weak pattern detector determines a risk level based on access count values of the target rows, activation (ACT) count values of the target rows, or a measure of Process, Voltage and Temperature (PVT) variations.

14. The memory device of claim 12,
wherein the target row refresh logic includes:
first registers configured to store addresses corresponding to the target rows;
second registers configured to store access count values with respect to the target rows; and
at least one counter configured to count accesses to each of the target rows.

15. The memory device of claim 11,
wherein the weak pattern detector outputs a risk level of each of the target rows corresponding to the weakness information,
wherein the risk level is one of a plurality of levels, and
wherein the memory device further comprises a fuse circuit or an anti-fuse circuit configured to store register values corresponding to the plurality of levels.

16. A memory system comprising:
at least one memory device; and
a controller configured to control the at least one memory device,
wherein the at least one memory device includes:
a memory cell array having a plurality of memory cells connected wordlines and bitlines;
a target row refresh logic configured to perform a refresh operation on at least one of target rows of the memory cell array in response to a RFM (Refresh Management Mode) command with a register update bit from a controller;
a first mode register configured to store a first value;
a second mode register configured to store a second value; and
a weak pattern detector configured to receive the RFM command, and latch weakness information in response to the register update bit,
wherein at least one of the first value and the second value is updated in response to an internal command,
wherein the first value and the second value correspond to the weakness information.

17. The memory system of claim 16,
wherein the controller includes:
a buffer memory configured to store the first value, the second value, and a third value; and
a refresh circuit configured to count a rolling accumulated activations (RAA) value for each of a plurality of target rows and to issue a RFM command based on the RAA value, the first value, the second value, and the third value,
wherein the first value, the second value, and the third value are transmitted from the at least one memory device during a booting operation, and
wherein the first value, the second value, and the third value are updated from the at least one memory device according to a register update bit value of the RFM command.

18. The memory system of claim 17,
wherein the refresh circuit issues the refresh management mode command when the RAA value is greater than the first value,
wherein the refresh circuit decrements the RAA value by a count corresponding to the second value when the refresh management mode command is issued.

19. The memory system of claim 16,
wherein the refresh circuit issues the refresh management mode command when the RAA value is greater than a product of the first value and the third value.

20. The memory system of claim 16,
wherein the memory controller transmits a read request for reading the first value, the second value, and the third value to the at least one memory device after transmitting the RFM command to the at least one memory device.

* * * * *